(12) United States Patent
Cox et al.

(10) Patent No.: US 7,292,317 B2
(45) Date of Patent: Nov. 6, 2007

(54) LITHOGRAPHIC APPARATUS AND DEVICE MANUFACTURING METHOD UTILIZING SUBSTRATE STAGE COMPENSATING

(75) Inventors: Henrikus Herman Marie Cox, Eindhoven (NL); Hernes Jacobs, Eindhoven (NL); Harmen Klaas Van Der Schoot, Vught (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 11/147,467

(22) Filed: Jun. 8, 2005

(65) Prior Publication Data

US 2006/0279716 A1    Dec. 14, 2006

(51) Int. Cl.
*G03B 27/58* (2006.01)
(52) U.S. Cl. ........................................ 355/72
(58) Field of Classification Search ........... 355/72, 355/75, 53; 310/10, 12; 378/34, 35
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,445,440 | B1 * | 9/2002 | Bisschops et al. ............ 355/53 |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,885,431 | B2 * | 4/2005 | Hara ........................... 355/53 |
| 2004/0008331 | A1 * | 1/2004 | Cox et al. ..................... 355/53 |
| 2004/0041104 | A1 | 3/2004 | Liebregts et al. |
| 2004/0130561 | A1 | 7/2004 | Jain |
| 2004/0252287 | A1 * | 12/2004 | Binnard et al. ............... 355/53 |
| 2005/0007572 | A1 | 1/2005 | George et al. |

FOREIGN PATENT DOCUMENTS

| WO | WO 98/33096 | 7/1998 |
| WO | WO 98/38597 | 9/1998 |

* cited by examiner

*Primary Examiner*—Diane Lee
*Assistant Examiner*—Chia-how Michael Liu
(74) *Attorney, Agent, or Firm*—Sterne, Kessler, Goldstein & Fox PLLC

(57) ABSTRACT

A lithographic apparatus has an illumination system that conditions a radiation beam and a patterning device support that supports a patterning device. The patterning device patterns the radiation beam. The lithographic apparatus also has a substrate support that supports a substrate, a machine frame that supports the substrate support, a projection system that projects the patterned beam onto a target portion of the substrate, and a substrate support drive that moves the substrate support in at least one direction. The lithographic apparatus can have a reaction mass, a balance mass, a base frame, where the substrate support drive is configured to generate a force in the at least one direction between the substrate support and the reaction mass, the balance mass, or the support frame.

11 Claims, 5 Drawing Sheets

LITHOGRAPHIC APPARATUS AND DEVICE MANUFACTURING METHOD UTILIZING SUBSTRATE STAGE COMPENSATING

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate (e.g., a silicon wafer or a glass plate, having a substantially circular shape or a polygonal shape, e.g., a rectangular shape). A lithographic apparatus can be used, for example, in the manufacture of integrated circuits (ICs). In such a case, a patterning device, that is alternatively referred to as a mask or a reticle, can be used to generate a circuit pattern to be formed on an individual layer of the IC. This pattern can be transferred onto a target portion (e.g., including part of, one, or several dies) on a substrate.

Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in that each target portion is irradiated by exposing an entire pattern onto the target portion at once, and so-called scanners, in that each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

Instead of a mask, the patterning device can comprise a patterning array that comprises an array of individually controllable elements, like a programmable mirror array or a programmable LCD array. Such a system, compared to a mask-based system, allows the pattern to be changed more quickly and for much less cost because the mask configuration exists in software only.

Instead of a circuit pattern, the patterning device can be used to generate other patterns, for example a color filter pattern or a matrix of dots, for a flat panel display. A flat panel display substrate can be rectangular in shape. Lithographic apparatus designed to expose a substrate of this type can provide an exposure region that covers a full width of the rectangular substrate, or that covers a portion of the width (for example, half of the width). The substrate can be scanned underneath the exposure region, while the mask or reticle is synchronously scanned through the projection beam. In this way, the pattern is transferred to the substrate. If the exposure region covers the full width of the substrate, then exposure can be completed with a single scan. If the exposure region covers, for example, half of the width of the substrate, then the substrate can be moved transversely after the first scan, and a further scan is typically performed to expose the remainder of the substrate.

Conventionally, a substrate is supported on a substrate support (also called a substrate stage), and a suitable drive is coupled to the substrate support for moving it in several degrees of freedom, e.g., in X, Y and Z directions and in Rx, Ry, and Rz directions when considering an XYZ system of coordinates. Reaction forces that are generated while moving the substrate support are transferred to a machine frame on that the substrate support is movably mounted, e.g., on air bearings.

The machine frame can contain a light source and the projection optics jointly generating a patterned radiation beam to be imaged on a substrate in the lithographic apparatus. The substrate must be positioned with high accuracy, in particular in an XY plane, with respect to the radiation beam.

When sizes of substrates increase, generally also the substrate support's dimensions grow larger, while at the same time its mass increases to maintain a required dimensional stability, both static and dynamical. As an example, a substrate having an increased size is a flat panel display substrate. Moving a relatively large mass substrate support with high speed requires high forces to be generated by the substrate support drive, whereas at the same time a high position accuracy is mandatory.

Controlling the position of the substrate support relative to the machine frame with a high accuracy implies that the substrate support drive has a relative large servo bandwidth, e.g., about 50 Hz. However, the substrate support position control bandwidth is limited by internal dynamics of the substrate support, and more particularly by the internal dynamics of the machine frame and the projection optics. Since the machine frame and the projection optics have a high mass, the internal dynamics of these components cannot be designed with a high eigen frequency that would enable a large substrate support position control bandwidth, resulting in an unacceptable substrate support performance.

Therefore, what is needed is a system and method that increase a substrate support position control bandwidth, such that a substrate support having a high mass can be positioned with a high accuracy.

SUMMARY

In one embodiment of the present invention, there is provided a lithographic apparatus comprising an illumination system, a patterning support, a patterning device, substrate support, a machine frame, a projection system, and a substrate support device. The illumination system conditions a radiation beam. The patterning support supports a patterning device. The patterning device patterns the radiation beam with a pattern form a patterned radiation beam. The substrate support supports a substrate. The machine frame supports the substrate support. The projection system projects the patterned radiation beam onto a target portion of the substrate. The substrate support drive configured to move the substrate support in at least one direction.

Alternatively, the lithographic apparatus can have a reaction mass coupled to the machine frame through a flexible coupling, wherein the substrate support drive is configured to generate a force in the at least one direction between the substrate support and the reaction mass.

In another example, the lithographic apparatus can have a balance mass movably supported by the machine frame, wherein the substrate support drive is configured to generate a force in the at least one direction between the substrate support and the balance mass.

In yet another example, the lithographic apparatus can have a base frame separately mounted from the machine frame, wherein the substrate support drive is configured to generate a force in the at least one direction between the substrate support and the base frame.

In a further example, the lithographic apparatus can have a base frame separately mounted from the machine frame, wherein the substrate support drive is configured to generate a force in the at least one direction between the substrate support and the base frame, the substrate support drive comprising a short-stroke drive and a long-stroke drive arranged in series.

In another embodiment of the present invention, a device manufacturing method is provided comprising the following steps. Projecting a patterned beam of radiation onto a substrate. Providing a substrate support constructed to support a substrate relative to a machine frame. Moving the substrate support in at least one direction by generating a force in the at least one direction between the substrate support and a reaction mass flexibly coupled to the machine frame.

In a still further embodiment of the present invention, a device manufacturing method is provided comprising the following steps. Projecting a patterned beam of radiation onto a substrate. Providing a substrate support constructed to support a substrate relative to a machine frame. Moving the substrate support in at least one direction by generating a force in the at least one direction between the substrate support and a balance mass movably supported by the machine frame.

In yet another embodiment of the present invention, a device manufacturing method is provided comprising the following steps. Projecting a patterned beam of radiation onto a substrate. Providing a substrate support constructed to support a substrate relative to a machine frame. Moving the substrate support in at least one direction by generating a force in the at least one direction between the substrate support and a base frame separately mounted from the machine frame.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in that the reference number first appears.

DETAILED DESCRIPTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
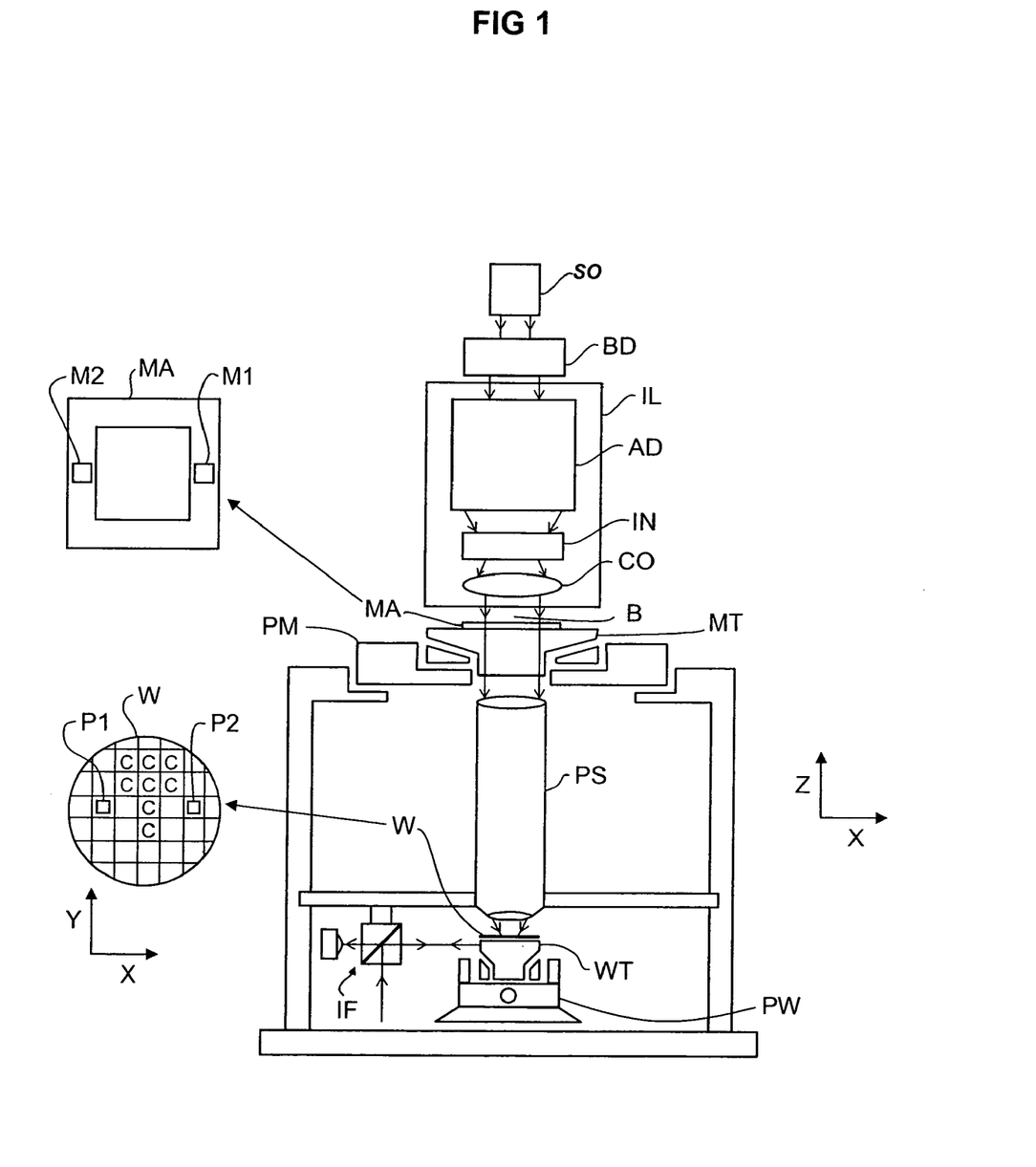
FIG. 1 schematically depicts a lithographic apparatus, according to one embodiment of the present invention.

FIG. 1 schematically depicts a general lithographic apparatus, according to one embodiment of the present invention. The apparatus includes an illumination system (illuminator) IL configured to condition a radiation beam B (e.g., UV radiation, DUV, EUV, or any other suitable radiation), a patterning device support structure (e.g., a pattern device table) MT constructed to support a patterning device (e.g., a static or dynamic patterning device) MA and connected to a first positioning device PM configured to accurately position the patterning device in accordance with certain parameters. The apparatus also includes a substrate table (e.g., a wafer table or glass substrate table) WT or "substrate support" constructed to hold a substrate (e.g., a resist-coated wafer or glass flat panel display substrate) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system can include various types of optical components, such as refractive, reflective, magnetic, electromagnetic, electrostatic or other types of optical components, or any combination thereof, for directing, shaping, or controlling radiation.

The patterning device support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure can be a frame or a table, for example, that can be fixed or movable as required. The patterning device support structure can ensure that the patterning device is at a desired position, for example with respect to the projection system. Any use of the terms "reticle" or "mask" herein can be considered synonymous with the more general term "patterning device," which can be either a static or dynamic patterning device.

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of that can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system."

As depicted here, the apparatus is of a transmissive type (e.g., employing a transmissive mask). Alternatively, the apparatus can be of a reflective type (e.g., employing a programmable mirror array of a type as referred to above, or employing a reflective mask).

The lithographic apparatus can be of a type having two (dual stage) or more substrate tables or "substrate supports" (and/or two or more mask tables or "mask supports"). In such "multiple stage" machines the additional tables or supports can be used in parallel, or preparatory steps can be carried out on one or more tables or supports while one or more other tables or supports are being used for exposure.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can include various other components, such as an integrator IN and a condenser CO. The illuminator can be used to condition the radiation beam, to have a desired uniformity and intensity distribution in its cross-section.

The radiation beam B is incident on the patterning device (e.g., mask MA), that is held on the patterning device support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (that is not explicitly depicted in FIG. 1) can be used to accurately position the mask MA with respect to the path of the radiation beam B, e.g., after mechanical retrieval from a mask library, or during a scan. In general, movement of the mask table MT can be realized with the aid of a long-stroke module (coarse positioning) and a short-stroke module (fine positioning), that form part of the first positioning device PM. Similarly, movement of the substrate table WT or "substrate support" can be realized using a long-stroke module and a short-stroke module, that form part of the second positioner PW.

In the case of a stepper (as opposed to a scanner) the mask table MT can be connected to a short-stroke actuator only, or can be fixed. Mask MA and substrate W can be aligned using mask alignment marks M1, M2 and substrate alignment marks P1, P2. Although the substrate alignment marks as illustrated occupy dedicated target portions, they can be located in spaces between target portions (these are known as scribe-lane alignment marks). Similarly, in situations in that more than one die is provided on the mask MA, the mask alignment marks can be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" can be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above. When a microlens array is used in a projection system of a maskless system, pixel grid imaging can be used to expose patterns from a patterning device, through the microlens array, and onto the substrate.

Combinations and/or variations on the above described modes of use or entirely different modes of use can also be employed.

Figure 2:
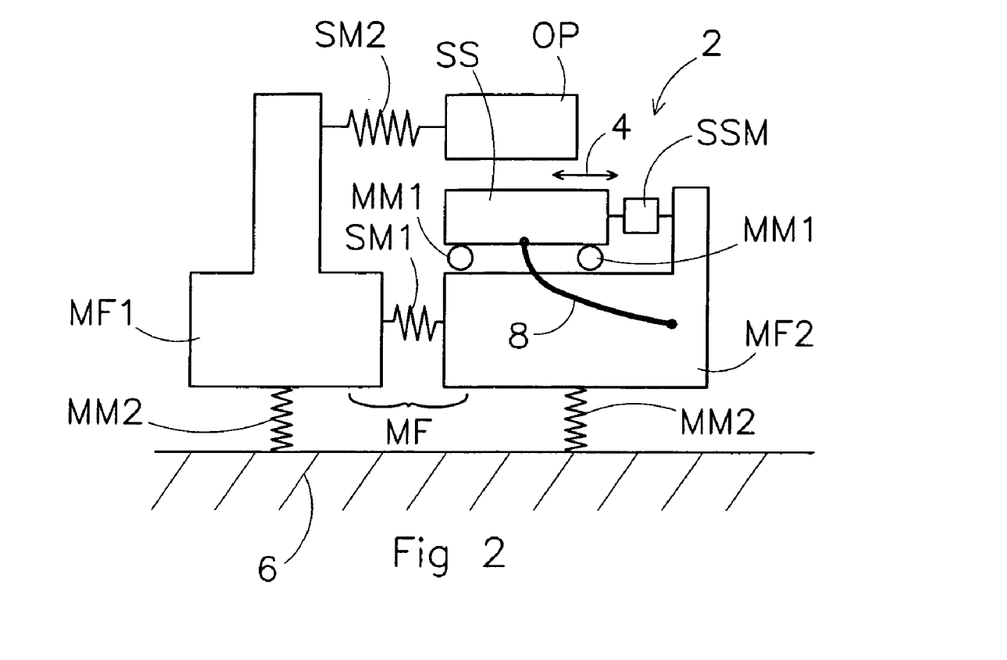
FIG. 2 schematically depicts a modeled arrangement of main components of a lithographic apparatus.

FIG. 2 shows some main components of a lithographic apparatus 2, according to one embodiment of the present invention. For ease of understanding, these components have been depicted as simple geometric shapes according to a mechanical dynamic model. The lithographic apparatus 2 includes a machine frame mass MF modeled as two mass parts MF1, MF2 interconnected by a spring member SM1, a projection optics mass OP connected to the machine frame mass part MF1 by a spring member SM2, and a substrate stage mass SS movable in the directions of double arrow 4 by a substrate stage motor SSM. The directions of the double arrow 4 can be parallel to a main scanning direction, but the mechanical model can represent also other directions of movement of the substrate stage mass SS. The substrate stage mass SS is movably mounted on the machine frame mass part MF2 through mounting members MM1, for example, with air mounts. The machine frame mass parts MF1, MF2 are mounted on a floor 6 by mounting members MM2, for example, with air mounts or other soft mounts. The spring members SM1 and SM2 represent a flexibility between and in the respective connected masses, where the flexibility can be an internal flexibility of the masses' structure, or an external flexibility built into the connection between the masses. The substrate stage mass SS is connected to the machine frame mass part MF2 by a cable and tubing slab 8 (that can also be referred to as an umbilical) for power, cooling and information transfer.

In the operation of the embodiment of FIG. 2, forces generated by the substrate stage motor SSM for moving the substrate stage mass SS (e.g., which can be over about 1,000 kg) relative to the machine frame mass MF directly excite the machine frame mass MF and the projection optics mass OP as reaction forces. Taking into regard the eigen frequencies of machine frame mass MF, the projection optics mass OP, and the mounting members MM2, which frequencies all are well below about 100 Hz, a position control system controlling the positioning of the substrate stage mass SS through a control of the substrate stage motor can only have a low bandwidth of about 10 Hz, resulting in an possibly unacceptable error in the positioning of the substrate stage SS in the order of micrometers.

Figure 3:
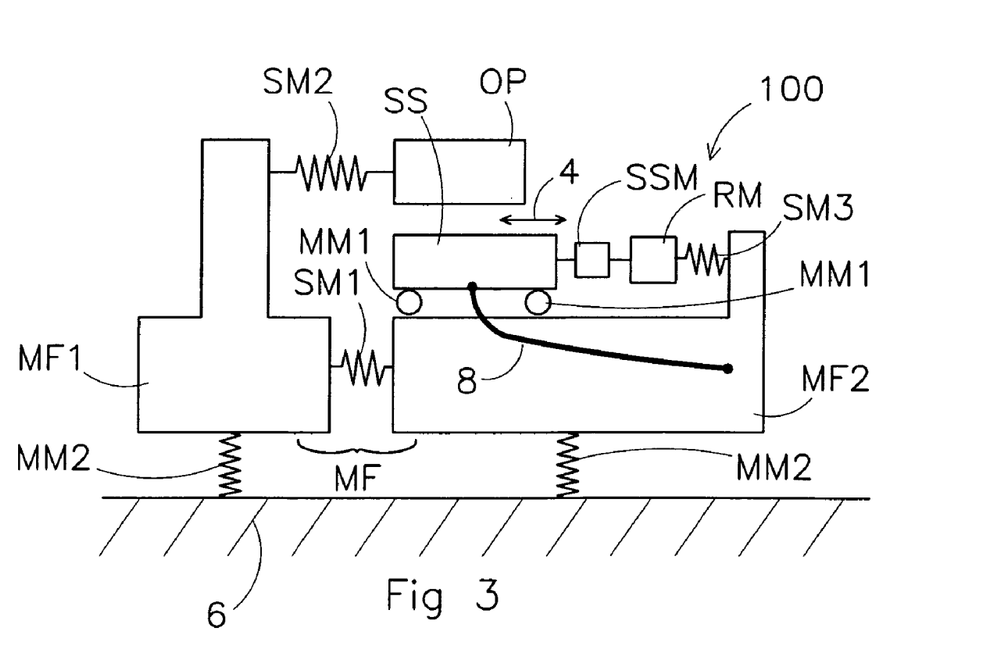
FIGS. 3, 4, 5, 6 and 7 schematically depict modeled arrangements of main components of a lithographic apparatus, according to various embodiments of the present invention.

FIG. 3 illustrates a mechanical dynamic model of a lithographic apparatus 100, according to one embodiment of the present invention. Similar components as depicted in FIG. 2 bear the same reference symbols. The embodiment of FIG. 3 differs from the embodiment of FIG. 2 in that the substrate stage motor SSM is not directly coupled to the machine frame MF and does not exert a reaction force on the machine frame mass MF directly. Instead, substrate stage motor SSM is coupled to a reaction mass RM, and exerts a reaction force on the reaction mass RM that is connected to the machine frame mass MF through a spring member SM3, for example, a soft spring.

In the operation of the embodiment of FIG. 3, the reaction force generated when the substrate stage motor SSM moves the substrate mass SS becomes filtered. The filtering characteristics can be selected such that an excitation of the machine frame mass MF and the projection optics mass OP essentially is excluded. If the eigen frequency of the reaction mass RM is designed to be at a low frequency, e.g., below about 10 Hz, then the bandwidth of the control system controlling the substrate stage motor can be designed to be an order of magnitude higher, while retaining a good stability of the control system, although the position error is affected by the eigen frequency of the reaction mass RM.

Figure 4:
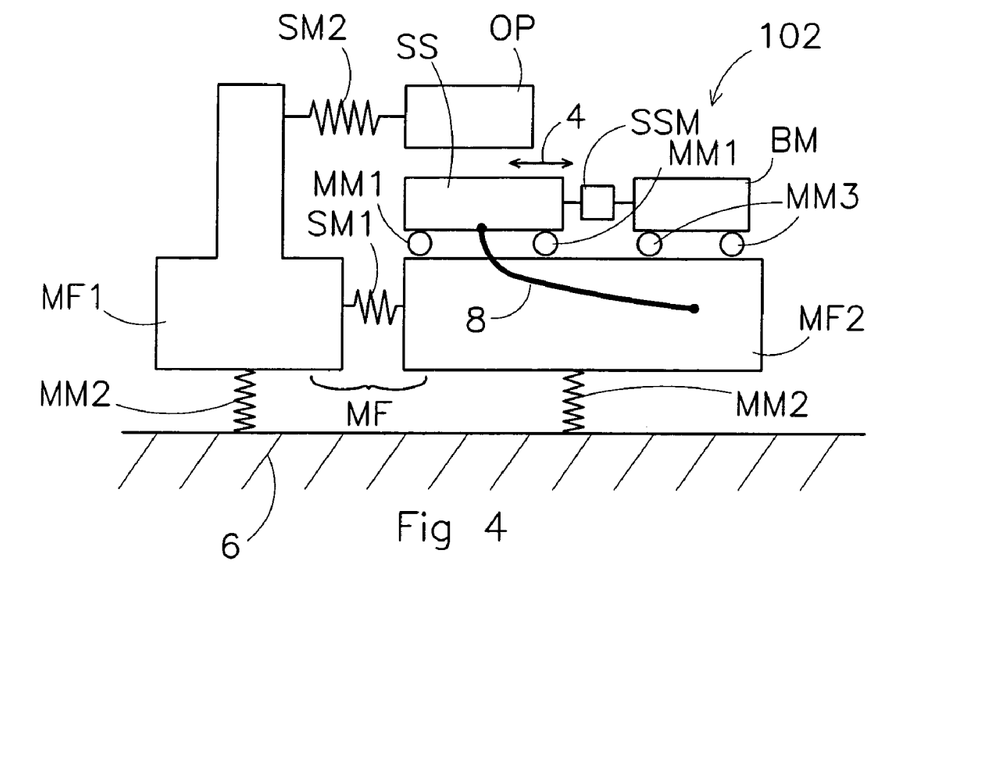

FIG. 4 illustrates a mechanical dynamic model of a lithographic apparatus 102, according to one embodiment of the present invention. Similar components as those depicted in FIG. 2 bear the same reference symbols. The embodiment of FIG. 4 differs from the embodiment of FIG. 2 in that the substrate stage motor SSM is not directly coupled to the machine frame MF, and does not exert a reaction force on the machine frame mass MF directly. Instead the substrate stage motor SSM is coupled to a balance mass BM and exerts a reaction force on the balance mass BM that is movably mounted on the machine frame mass MF through mounting members MM3, for example, with air bearings.

In the operation of the embodiment of FIG. 4, the reaction force generated when the substrate stage motor SSM moves the substrate stage mass SS essentially does not influence the machine frame mass MF and the projection optics mass OP. Thus, the dynamics of the machine frame mass MF and the projection optics mass OP essentially play no role in a position control system for controlling the positioning of the substrate stage mass SS through a control of the substrate stage motor. As a result, a position error of the substrate stage mass SS can be kept within a required specification.

Figure 5:
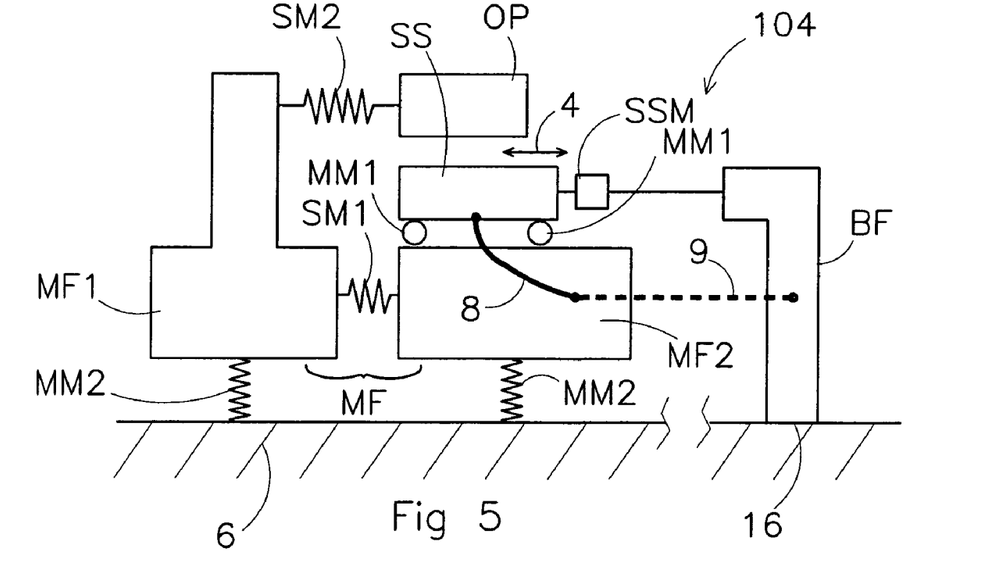

FIG. 5 illustrates a mechanical dynamic model of a lithographic apparatus 104, according to one embodiment of the present invention. Similar components as those depicted in FIG. 2 bear the same reference symbols. The embodiment of FIG. 5 differs from the embodiment of FIG. 2 in that the substrate stage motor SSM is not directly coupled to the machine frame mass MF and does not exert a reaction force on the machine frame mass MF directly. Instead, the substrate stage motor SSM is coupled to a base frame mass BF, and exerts a reaction force on the base frame mass BF that is connected to a floor 16, which can be the same as floor 6, or separate from floor 6.

In the operation of the embodiment of FIG. 5, the reaction force generated when the substrate stage motor SSM moves the substrate stage mass SS essentially does not influence the machine frame mass MF and the projection optics mass OP. Thus, the dynamics of the machine frame mass MF and the projection optics mass OP essentially play no role in a position control system for controlling the positioning of the substrate stage mass SS through a control of the substrate stage motor SSM. As a result, a position error of the substrate stage mass SS can be kept within a required specification.

In the embodiment of FIG. 5, the cable and tubing slab 8 can be connected between the substrate stage mass SS and the machine frame mass part MF2, like in FIGS. 2-4. However, the cable and tubing slab 8 can also be connected between the substrate stage mass SS and the base frame mass BF, as indicated by the lines 8 and 9 in FIG. 5, without being connected to the machine frame mass MF. It is noted that in either instance the cable and tubing slab 8 creates varying disturbance forces on the substrate stage mass SS in different positions. For an accurate positioning of the substrate stage mass SS, these forces should not exceed a few Newtons. However, in practice the disturbance forces can be an order of magnitude higher, which can result in a positioning error that exceeds a required specification. In the embodiments of the invention discussed below, the disturbance forces generated by the cable and tubing slab 8 can be minimized.

Figure 6:
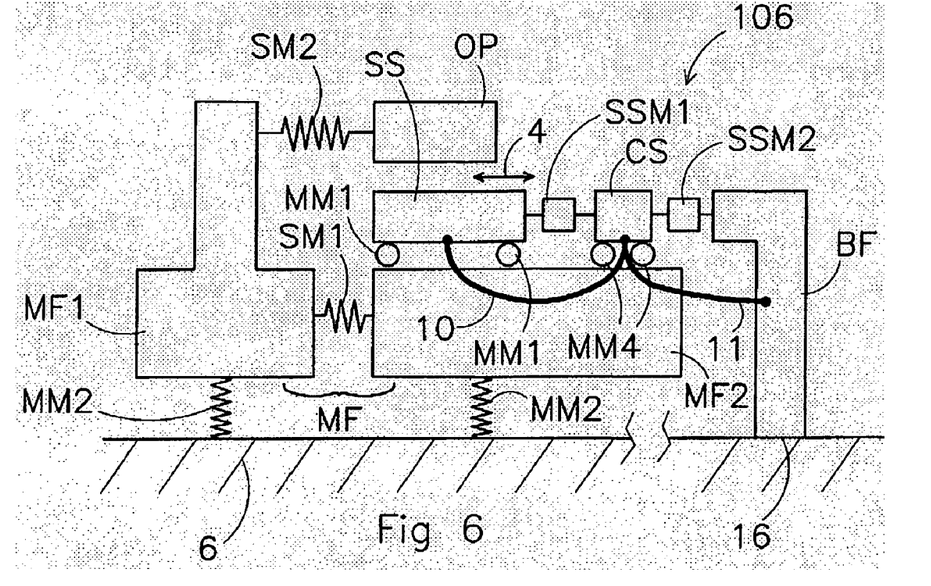

FIG. 6 illustrates a mechanical model of a lithographic apparatus 106, according to one embodiment of the present invention. Similar components as depicted in FIG. 5 bear the same reference symbols. The embodiment of FIG. 6 differs from the embodiment of FIG. 5 in that the substrate stage motor SSM is formed by two separate motors, a short-stroke substrate stage motor SSM1 and a long-stroke substrate stage motor SSM2. The short-stroke substrate stage motor SSM1 and the long-stroke substrate stage motor both contain two parts. One of the parts of the short-stroke substrate stage motor SSM1 is coupled to the substrate stage mass SS and the other part of the short-stroke substrate stage motor SSM1 is coupled to one of the parts of the long-stroke substrate stage motor SSM2 through a cable shuttle mass CS mounted on mounting members MM4, like air bearings. The other part of the long-stroke substrate stage motor SSM2 is coupled to a base frame mass BF.

In the operation of the embodiment of FIG. 6, the reaction force generated when the substrate stage mass SS is moved is transferred to the base frame mass BF through short-stroke substrate stage motor SSM1, cable shuttle mass CS, and long-stroke substrate stage motor SSM2. The reaction force essentially does not influence the machine frame mass MF and the projection optics mass OP. Thus, the dynamics of the machine frame mass MF and the projection optics mass OP essentially play no role in a position control system for controlling the positioning of the substrate stage mass SS through a control of the substrate stage motors SSM1 and SSM2. As a result, a position error of the substrate stage mass SS can be kept within a required specification.

In the embodiment of FIG. 6, a first part 10 of the cable and tubing slab is connected between the substrate stage mass SS and the cable shuttle mass CS, and a second part 11 of the cable and tubing slab is connected between the cable shuttle mass CS and the base frame mass BF. The cable and tubing slab 10, 11 are not connected to the machine frame mass MF. The short-stroke substrate stage motor SSM1 has a limited stroke, and thus can be designed very linear and thus also very accurate. The part 10 of the cable and tubing slab virtually does not generate any disturbance forces on the substrate stage mass SS, since the movement of the cable shuttle mass CS follows the movement of the substrate stage mass SS. The long-stroke substrate stage motor SSM2 counteracts the effect of disturbance forces generated by the part 11 of the cable and tubing slab.

Figure 7:
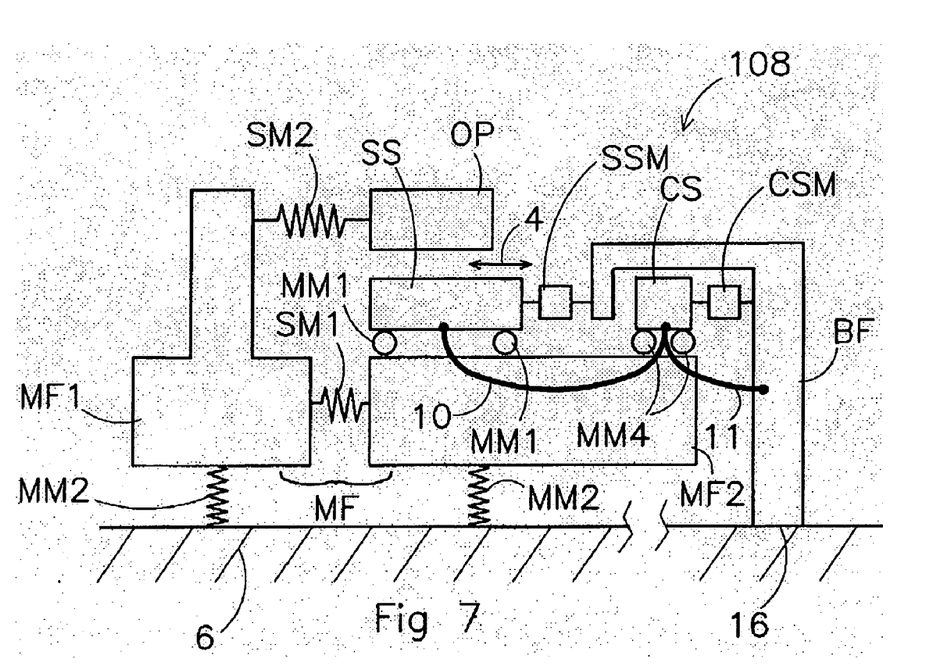

FIG. 7 illustrates a mechanical dynamic model of a lithographic apparatus 108, according to one embodiment of the present invention. Similar components as depicted in FIG. 6 bear the same reference symbols. The embodiment of FIG. 7 differs from the embodiment of FIG. 6 in that the substrate stage motor SSM is arranged between the substrate stage mass SS and the base frame mass BF, and that the cable shuttle mass CS is moved separately from the substrate stage mass SS by a cable shuttle motor CSM.

Like in the embodiment of FIG. 5, in the operation of the embodiment of FIG. 7 the reaction force generated when the substrate stage mass SS is moved is transferred to the base frame mass BF through substrate stage motor SSM. The reaction force essentially does not influence the machine frame mass MF and the projection optics mass OP. Thus, the dynamics of the machine frame mass MF and the projection optics mass OP essentially play no role in a position control system for controlling the positioning of the substrate stage mass SS through a control of the substrate stage motor SSM. As a result, a position error of the substrate stage mass SS can be kept within a required specification.

In the embodiment of FIG. 7, the reaction force generated when the cable shuttle mass CS is moved is transferred to the base frame mass BF through cable shuttle motor CSM. Also, this reaction force essentially does not influence the machine frame mass MF and the projection optics OP, such that the dynamics of the machine frame mass MF and the projection optics mass OP essentially play no role in a position control system for controlling the positioning of the substrate stage mass SS through a control of the substrate stage motor SSM.

Both the substrate stage motor SSM and the cable shuttle motor CSM have a large operating range, and the movement of the cable shuttle motor CSM is made to follow the movement of the substrate stage motor SSM. The cable shuttle motor CSM counteracts the effect of disturbance forces generated by the part 11 of the cable and tubing slab. Unlike the long-stroke substrate stage motor SSM2 connected to the cable shuttle mass CS in the embodiment shown in FIG. 6, the cable shuttle motor CSM connected to the cable shuttle mass CS in the embodiment shown in FIG. 7 need not be very powerful.

Figure 8:
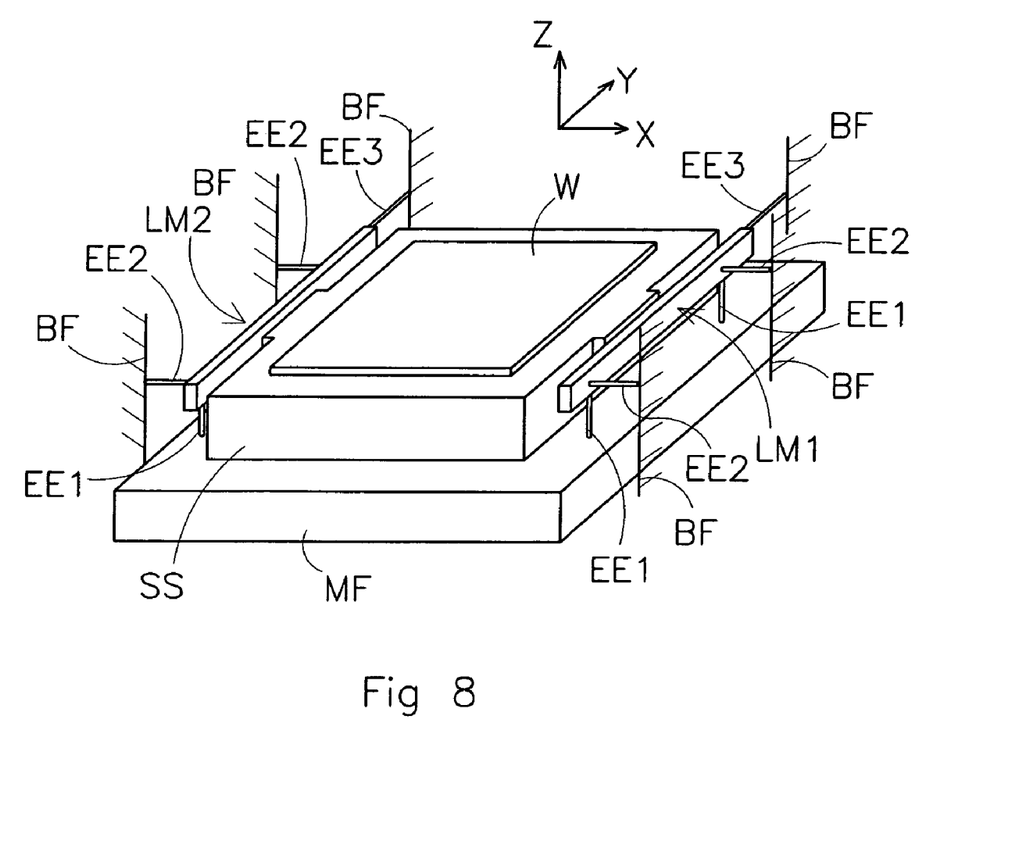
FIG. 8 schematically shows in perspective view a part of the arrangement of FIG. 5 or 7, according to one embodiment of the present invention.

FIG. 8 illustrates a support of the substrate stage mass SS to a base frame mass through a substrate stage motor, according to one embodiment of the present invention. A coordinate system X, Y, Z is defined as indicated for ease of reference below. The substrate stage mass SS is depicted schematically as a rectangular body having a center of gravity situated in a plane indicated by dashed line 120. The substrate stage mass SS supports a substrate W that is depicted schematically as a rectangular panel. However, the substrate can have various different geometries and can have a substantially circular or other round or polygonal circumference. The substrate stage mass SS can be supported in a Z direction using, for example, air bearings, on a machine frame mass MF or machine frame mass MF2 (FIG. 7). At opposite sides of the substrate stage mass SS linear substrate stage motors LM1, LM2 are provided that can provide forces in X direction and Y direction. A rotor of each motor LM1, LM2 is mounted at each of the opposite sides to the substrate stage mass SS, while a stator of each motor LM1, LM2 is supported in a Z direction on the machine frame mass MF by elongate elements EE1. The stator of each motor LM1, LM2 further is supported in an X direction on a base frame mass BF (schematically indicated) by elongate elements EE2. The stator of each motor LM1, LM2 still further is supported in a Y direction on a base frame mass BF (schematically indicated) by elongate elements EE3.

The elongate elements EE1-EE3 can be provided in a number and in an arrangement as necessary to generate the forces required. The elongate elements EE1-EE3 are stiff in their longitudinal direction, and less stiff (flexible) in one or more directions at right angles to their longitudinal direction. The elongate elements EE1-EE3 can be, but are not limited to, sprits, leaf springs, or other similar elements. In moving the substrate stage mass SS in an X and/or Y direction by the motors LM1, LM2, substantially no reaction forces are transmitted to the machine frame mass MF.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

Although specific reference can have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, can refer to any one or combination of various types of optical components, including refractive, reflective, magnetic, electromagnetic and electrostatic optical components.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A lithographic apparatus, comprising:
an illumination system that conditions a radiation beam;
a patterning device support that supports a patterning device, the patterning device imparting the radiation beam with a pattern to form a patterned radiation beam;
a substrate support that supports a substrate;
a machine frame that supports the substrate support;
a projection system that projects the patterned radiation beam onto a target portion of the substrate;
a substrate support drive that moves the substrate support in at least one direction;
a base frame separately mounted from the machine frame, wherein the substrate support drive is configured to generate a force in the at least one direction between the substrate support and the base frame; and
a flexible umbilical coupled between the substrate support and the base frame.

2. The lithographic apparatus of claim 1, wherein the substrate support drive is connected to the base frame by elongate elements having a first stiffness in their longitudinal direction and having a second stiffness in a direction at right angles to their longitudinal direction, the second stiffness being lower than the first stiffness.

3. The lithographic apparatus of claim 1,
wherein the flexible umbilical supplies at least one of power, cooling and information transfer to the substrate stage.

4. The lithographic apparatus of claim 3, further comprising:
an umbilical support; and
an umbilical support drive that moves the umbilical support in the at least one direction between the umbilical support and the base frame, a first part of the umbilical being connected between the substrate support and the umbilical support and a second part of the umbilical being connected between the umbilical support and the base frame.

5. The lithographic apparatus of claim 1, wherein the machine frame further comprises a first and second machine frame pieces coupled together using a flexible coupling.

6. A lithographic apparatus, comprising:
an illumination system that conditions a radiation beam;
a patterning device support that supports a patterning device, the patterning device imparting the radiation beam with a pattern to form a patterned radiation beam;
a substrate support that supports a substrate;
a machine frame that supports the substrate support;
a projection system that projects the patterned radiation beam onto a target portion of the substrate;
a substrate support drive that moves the substrate support in at least one direction and comprising a short-stroke drive and a long-stroke drive arranged in series;
a base frame separately mounted from the machine frame, wherein the substrate support drive is configured to generate a force in the at least one direction between the substrate support and the base frame; and
a flexible umbilical coupled between the substrate support and the base frame.

7. The lithographic apparatus of claim 6,
wherein the flexible umbilical supplies at least one of power, cooling and information transfer to the substrate stage 8. The lithographic apparatus of claim 7, wherein:
a first part of the umbilical is connected between the substrate support and an umbilical support connected between the short-stroke drive and the long-stroke drive; and
a second part of the umbilical is connected between the umbilical support and the base frame.

9. The lithographic apparatus of claim 6, wherein the machine frame further comprises a first and second machine frame pieces coupled together using a flexible coupling.

10. A system, comprising:
an illumination device configured to produce a radiation beam;
a patterning device support that supports a patterning device, the patterning device imparting the radiation beam with a pattern to form a patterned radiation beam;
a substrate support that supports a substrate;
a machine frame configured to support the substrate support;
a projection system configured to project the patterned beam onto a target portion of the substrate;
a substrate support drive that moves the substrate support in at least one direction;
a base frame separately mounted from the machine frame;
a flexible umbilical configured to supply the substrate stage, the flexible umbilical being connected between the substrate support and the base frame;
an umbilical support; and
an umbilical support drive configured to move the umbilical support in the at least one direction between the umbilical support and the base frame, a first part of the umbilical being connected between the substrate support and the umbilical support and a second part of the umbilical being connected between the umbilical support and the base frame.

11. The system of claim 10, wherein the umbilical cord is configured to supply power, cooling, or information to the substrate stage.

* * * * *